US011112373B1

(12) United States Patent
AlSinan et al.

(10) Patent No.: US 11,112,373 B1
(45) Date of Patent: Sep. 7, 2021

(54) SYSTEMS AND METHODS FOR SLICE SELECTIVE NUCLEAR MAGNETIC RESONANCE TESTING OF FRACTURED CORE PLUGS TO DETERMINE IN-SITU PORE VOLUME

(71) Applicant: Saudi Arabian Oil Company, Dhahran (SA)

(72) Inventors: Marwah Mufid AlSinan, Dhahran (SA); Hyung Tae Kwak, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 0 days.

(21) Appl. No.: 16/801,492

(22) Filed: Feb. 26, 2020

(51) Int. Cl.
*G01N 24/08* (2006.01)
*G01R 33/483* (2006.01)
*G01R 33/44* (2006.01)
*G01V 3/14* (2006.01)

(52) U.S. Cl.
CPC ......... *G01N 24/081* (2013.01); *G01R 33/445* (2013.01); *G01R 33/4835* (2013.01); *G01V 3/14* (2013.01)

(58) Field of Classification Search
CPC ................ G01N 24/081; G01R 33/445; G01R 33/4835; G01R 33/50; G01R 33/448; G01V 3/14
See application file for complete search history.

(56) References Cited

U.S. PATENT DOCUMENTS

| 7,053,611 | B2 | 5/2006 | Freedman |
| 9,176,251 | B2 | 11/2015 | Singer et al. |
| 9,405,037 | B2 | 8/2016 | Al-Muthana et al. |
| 9,625,601 | B2 | 4/2017 | Liu et al. |

(Continued)

FOREIGN PATENT DOCUMENTS

WO  2018195646 A1  11/2018

OTHER PUBLICATIONS

AAPG Wiki "Porosity" available as of Jun. 25, 2019 at: https://wiki.aapg.org/Porosity#Pore_volume_measurement; pp. 1-10.

(Continued)

*Primary Examiner* — Rishi R Patel
(74) *Attorney, Agent, or Firm* — Bracewell LLP; Constance G. Rhebergen; Christopher L. Drymalla

(57) ABSTRACT

Provided is a local slice selective $T_2$ nuclear magnetic resonance (NMR) test procedure that includes: (1) identifying a location of a fracture within a core plug; (2) conducting an initial local slice selective $T_2$ NMR test on a slice of the plug that corresponds to the location to generate initial $T_2$ measurements; (3) determining an initial fracture pore volume of the fracture based on the initial $T_2$ measurements; (4) conducting an in-situ local slice selective $T_2$ NMR test on the slice of the plug to generate in-situ $T_2$ measurements and corresponding measures of a volume of fluid expelled from the plug; (5) determining an in-situ fracture pore volume for the fracture based on the in-situ $T_2$ measurements; and (6) comparing the volume of water to a difference between the (Continued)

initial and the in-situ fracture pore volumes to confirm the accuracy of the in-situ pore volume.

27 Claims, 5 Drawing Sheets

(56) References Cited

U.S. PATENT DOCUMENTS 9,720,124 B2 8/2017 Kadayam Viswanathan et al.
10,161,891 B1 * 12/2018 Tian .................. E21B 49/02

OTHER PUBLICATIONS

Bisai, Rohan; "A Study on Modes of Rock Failure Under Uniaxial Compression" Thesis submitted to the Department of Civil Engineering National Institute of Technology Rourkela—769008, May 2014; pp. 1-53.
Brown, Stephen R. et al.; "Broad Bandwidth Study of the Topography of Natural Rock Surfaces" Journal of Geophysical Research, vol. 90, No. B14, Dec. 10, 1985; pp. 12575-12582.
Core Laboratories "Rock Properties | Advanced Rock Properties—Pore Volume Compressibility available as of Jan. 4, 2019 at the website" https://www.corelab.com/ps/pore-volume-compressibility.
Dijk, Peter et al.; "Investigation of flow in water-saturated rock fractures using nuclear magnetic resonance imaging (NMRI)" Water Resources Research, vol. 35, No. 2, Feb. 1999; pp. 347-360.
Dudley, J.W. et al.; "Suggested Methods for Uniaxial-Strain Compressibility Testing for Reservoir Geomechanics" Rock Mechanics and Rock Engineering, vol. 49, Issue 10; pp. 4153-4178.
Gentier, Sylvie S. et al.; "Mapping Fracture Aperture as a Function of Normal Stress Using a Combination of Casting, Image Analysis and Modeling Techniques" Int. J. Rock Mech. & Min. Sci. 34:3-4, paper No. 132; pp. 1-14.
Hakami, Eva et al.; "Aperture Measurements and Flow Experiments on a Single Natural Fracture" Int. J. Rock Mech. Min. Sci. & Geomech. Abstr. vol. 33, No. 4, 1996; pp. 395-404.
Indiamart; "triaxial cell" available as of Feb. 26, 2020 at: https://dir.indiamart.com/search.mp?ss=triaxial+cell&src=as-popular%3Akwd%3Dtriaxial%3Apos%3D2%3Acat%3D-2%3Amcat%3D-2; pp. 1-6.
Keller, A.; "High Resolution, Non-destructive Measurement and Characterization of Fracture Apertures" Int. J. Rock Mech. Min. Sci. vol. 35, No. 8, 1998; pp. 1037-1050.
Lee, H.S. et al.; "Hydraulic Characteristics of Rough Fractures in Linear Flow under Normal and Shear Load" Rock Mech. Rock Engng. (2002) 35 (4); pp. 299-318.
Mitchell, J. et al.; "Magnetic resonance imaging in laboratory petryphysical core analysis" Physics Reports 526 (2013); pp. 165-225.
Petrov, Oleg V. et al.; "T2 distribution mapping profiles with phase-encode MRI" Journal of Magnetic Resonance 209 (2011); pp. 39-46.
Petrov, Oleg V. et al.; "Two-dimensional T2 distribution mapping in porous solids with phase encode MRI" Journal of Magnetic Resonance 212 (2011); pp. 102-108.
Ramskill, N.P. et al.; "Fast imaging of laboratory core floods using 3D compressed sensing RARE MRI" Journal of Magnetic Resonance 270 (2016); pp. 187-197.
Randall, Leslie et al.; "Strategy to Reduce Uncertainties in Core Analysis Programs Through the Use of Magnetic Resonance Imaging: A New Perspective" SCA2002-36 (2004); pp. 1-12.
Sharifzadeh, Mostafa et al.; "Rock Joint Surfaces Measurement and Analysis of Aperture Distribution under Different Normal and Shear Loading Using GIS" Rock Mech. Rock Eng., 41 (2); pp. 299-323.
Soldal, M. et al.; "Rock visualization using micro-CT scanner and X-ray transparent triaxial apparatus" SCA2017-073, International Symposium of the Society of Core Analysts, Vienna, 2017; pp. 1-9.
Vashaee, S et al.; "Region of interest selection of long core plug samples by magnetic resonance imaging: profiling and local T2 measurement" Measurement Science and Technology 25 (2014); pp. 1-10.
Vashaee, S. et al.; "Local T2 measurement employing longitudinal Hadamard encoding and adiabatic inversion pulses in porous media" Journal of Magnetic Resonance 261 (2015); pp. 141-148.
Vashaee, Sarah; "Slice Selective T2 Distribution Measurements by Employing GIT Systems (User Manual)" University of New Brunswick, Nov. 2, 2016; pp. 1-15.

* cited by examiner

US 11,112,373 B1

SYSTEMS AND METHODS FOR SLICE SELECTIVE NUCLEAR MAGNETIC RESONANCE TESTING OF FRACTURED CORE PLUGS TO DETERMINE IN-SITU PORE VOLUME

FIELD

Embodiments relate generally to assessment of rock and more particularly to systems and methods for determining in-situ fracture pore volume of fractured core plugs.

BACKGROUND

Petroleum exploration and production typically emphasizes maximizing reservoir production in a safe and efficient manner. This can include employing enhanced oil recovery (EOR) techniques, such as thermal injection, gas injection and chemical injection, to assist in extracting hydrocarbons from oil and gas reservoirs. These and other techniques typical rely on accurate assessments of properties of a reservoir to determine its potential for petroleum production, as well as to determine the appropriate techniques for maximizing petroleum production from the reservoir. Porosity of a reservoir, for example, is defined as a ratio of void space (or "pore volume") to solid material (or "bulk volume"). Porosity can characterize the storage capacity of a reservoir and the ability of the reservoir to transmit fluids (or "permeability"). Thus porosity can be important in assessing a reservoir's potential for production and determining how to develop the reservoir.

SUMMARY

Pore volume, porosity and other reservoir properties can be difficult to ascertain, especially for vuggy or fractured samples. For example, a measure of pore volume (which may be used to determine porosity) is often measured by injecting or saturating a sample with a gas or a liquid and measuring the volume of gas or liquid that is absorbed into the sample. Unfortunately, such a technique is not well suited for vuggy and fractured samples.

Recognizing these and other shortcomings of existing techniques, provided are systems and methods for determining in-situ fracture pore volume of fractured core plugs. Certain embodiments provide local slice selective $T_2$ nuclear magnetic resonance (NMR) testing of a saturated (or "flooded") core plug under in-situ conditions to determine an accurate measurement of a pore volume of a fracture in the core plug. The fracture pore volume may be used, for example, to determine an in-situ fracture pore volume of the core plug or associated rock, such as rock of a reservoir from which the core plug is extracted, and the reservoir may be developed based on the in-situ fracture pore volume.

In some embodiments, a local slice selective $T_2$ NMR test procedure includes the following: (1) identifying a location of a fracture within a core plug; (2) conducting an initial local slice selective $T_2$ NMR test on a slice of the core plug that corresponds to the location of the fracture to generate initial $T_2$ measurements for the slice (for example, conducting a local slice selective $T_2$ NMR test on the slice of the core plug while the core plug is subjected to initial conditions to generate initial $T_2$ measurements for the slice); (3) determining an initial fracture pore volume of the fracture based on the initial $T_2$ measurements; (4) conducting an in-situ local slice selective $T_2$ NMR test on the slice of the core plug to generate in-situ $T_2$ measurements for the slice and corresponding measures of a volume of fluid expelled from the core plug (for example, conducting a local slice selective $T_2$ NMR test on the slice of the core plug while the core plug is subjected to in-situ conditions, such as elevated levels of confining pressure or shear stress, to generate in-situ $T_2$ measurements for the slice and measuring the volume of fluid expelled from the core plug as a result of subjecting the core to the in-situ conditions); (5) determining an in-situ fracture pore volume for the fracture based on the in-situ $T_2$ measurements; and (6) comparing the volume of water expelled to a difference between the initial fracture pore volume determined and the in-situ fracture pore volume determined to confirm the accuracy of the in-situ pore volume for the fracture determined.

Provided in some embodiments is a method of slice selective NMR testing of a fractured core plug. The method including the following: obtaining a fractured core plug including a fracture; saturating the fractured core plug with a saturating fluid to introduce the saturating fluid into the fracture; sealing the fractured core plug to inhibit the saturating fluid from leaking out of the fracture; identifying a location of the fracture within the core plug, the location including a position and orientation of the fracture; identifying a slice of the core plug corresponding to the location of the fracture; conducting initial local slice selective NMR testing of the core plug that includes the following: subjecting the core plug to baseline conditions, the baseline conditions including a first stress level; conducting an initial NMR scan of the core plug to acquire initial $T_2$ NMR measurements, the initial NMR scan of the core plug including an NMR scan of the slice of the core plug corresponding to the fracture while the core plug is subjected to the baseline conditions; and determining, based on the initial $T_2$ NMR measurements, an initial fracture pore volume of the fracture; conducting in-situ local slice selective NMR testing of the core plug that includes the following: determining in-situ conditions of the core plug, the in-situ conditions including an in-situ stress level for the core plug; subjecting the core plug to in-situ conditions including a second stress level that is greater than the first stress level and that corresponds to the in-situ stress level; conducting an in-situ NMR scan of the core plug to acquire in-situ $T_2$ NMR measurements, the in-situ NMR scan of the core plug including an NMR scan of the slice of the core plug corresponding to the fracture while the core plug is subjected to the in-situ conditions; measuring a volume of water expelled from the core plug in response to subjecting the core plug to the in-situ condition; determining, based on the in-situ $T_2$ NMR measurements, an in-situ fracture pore volume of the fracture; determining a difference between the initial fracture pore volume of the fracture and the in-situ fracture pore volume of the fracture; comparing the difference between the initial fracture pore volume of the fracture and the in-situ fracture pore volume of the fracture to the volume of water expelled; and verifying, based on the comparison of the difference between the initial fracture pore volume of the fracture and the in-situ fracture pore volume of the fracture to the volume of water expelled, the in-situ fracture pore volume of the fracture.

In some embodiments, identifying the location of the fracture within the core plug includes imaging the core plug to identify the location of the fracture within the core plug. In certain embodiments, the imaging includes x-ray imaging or magnetic resonance imaging (MRI) of the core plug. In some embodiments, sealing the fractured core plug includes coating the fractured core plug with wax or paraffin. In certain embodiments, the in-situ local slice selective NMR testing of the core plug is conducted using a tri-axial NMR test fixture including a first gradient coil oriented in an x direction, a second gradient coil oriented in a y direction, and a third gradient coil oriented in a z direction, where the orientation of the fracture is oriented at an angle relative to two or more of the x, y and z directions, and where the NMR scans of the slice of the core plug each include selectively energizing two or more of the first, second and third gradient coils to obtain corresponding $T_2$ measurements for the slice. In some embodiments, the in-situ conditions include a confining stress or shear stress that is greater than a confining stress or shear stress of the first stress level. In certain embodiments, the in-situ conditions include an elevated in-situ stress level, and the in the in-situ local slice selective NMR testing of the core plug includes iteratively increasing a stress level applied to the core plug to reach the elevated in-situ stress level, and, for each iteration of an increase of the stress level applied to the core plug, conducting an in-situ NMR scan of the core plug and measuring a volume of water expelled from the core plug. In some embodiments, the core plug is extracted from a formation of a reservoir and the method further includes developing the reservoir based on the in-situ fracture pore volume of the fracture. In some embodiments, developing the reservoir includes: determining, based on the in-situ fracture pore volume of the fracture, operating parameters for a well in the formation; and operating the well in accordance with the operating parameters.

Provided in some embodiments is a non-transitory computer readable storage medium having program instructions for slice selective NMR testing of a fractured core plugs stored thereon, where the program instructions are executable by a computer processor to cause the following operations: identifying a location of a fracture within a core plug, the location including a position and orientation of the fracture, the core plug being saturated with a saturating fluid to introduce the saturating fluid into the fracture and being sealed to inhibit the saturating fluid from leaking out of the fracture; identifying a slice of the core plug corresponding to the location of the fracture; conducting initial local slice selective NMR testing of the core plug including: subjecting the core plug to baseline conditions, the baseline conditions including a first stress level; conducting an initial NMR scan of the core plug to acquire initial $T_2$ NMR measurements, the initial NMR scan of the core plug including an NMR scan of the slice of the core plug corresponding to the fracture while the core plug is subjected to the baseline conditions; and determining, based on the initial $T_2$ NMR measurements, an initial fracture pore volume of the fracture; conducting in-situ local slice selective NMR testing of the core plug including the following: determining in-situ conditions of the core plug, the in-situ conditions including an in-situ stress level for the core plug; subjecting the core plug to in-situ conditions including a second stress level that is greater than the first stress level and that corresponds to the in-situ stress level; conducting an in-situ NMR scan of the core plug to acquire in-situ $T_2$ NMR measurements, the in-situ NMR scan of the core plug including an NMR scan of the slice of the core plug corresponding to the fracture while the core plug is subjected to the in-situ conditions; measuring a volume of water expelled from the core plug in response to subjecting the core plug to the in-situ condition; determining, based on the in-situ $T_2$ NMR measurements, an in-situ fracture pore volume of the fracture; determining a difference between the initial fracture pore volume of the fracture and the in-situ fracture pore volume of the fracture; comparing the difference between the initial fracture pore volume of the fracture and the in-situ fracture pore volume of the fracture to the volume of water expelled; and verifying, based on the comparison of the difference between the initial fracture pore volume of the fracture and the in-situ fracture pore volume of the fracture to the volume of water expelled, the in-situ fracture pore volume of the fracture.

In some embodiments, identifying the location of the fracture within the core plug includes imaging the core plug to identify the location of the fracture within the core plug. In certain embodiments, the imaging includes x-ray imaging or magnetic resonance imaging (MRI) of the core plug. In some embodiments, the exterior of the fractured core plug is coated with wax or paraffin. In certain embodiments, the in-situ local slice selective NMR testing of the core plug is conducted using a tri-axial NMR test fixture including a first gradient coil oriented in an x direction, a second gradient coil oriented in a y direction, and a third gradient coil oriented in a z direction, where the orientation of the fracture is oriented at an angle relative to two or more of the x, y and z directions, and where the NMR scans of the slice of the core plug each include selectively energizing two or more of the first, second and third gradient coils to obtain corresponding $T_2$ measurements for the slice. In some embodiments, the in-situ conditions include a confining stress or shear stress that is greater than a confining stress or shear stress of the first stress level. In certain embodiments, the in-situ conditions include an elevated in-situ stress level, and where the in-situ local slice selective NMR testing of the core plug includes iteratively increasing a stress level applied to the core plug to reach the elevated in-situ stress level, and, for each iteration of an increase of the stress level applied to the core plug, conducting an in-situ NMR scan of the core plug and measuring a volume of water expelled from the core plug. In some embodiments, the core plug is extracted from a formation of a reservoir and the reservoir is developed based on the in-situ fracture pore volume of the fracture. In certain embodiments, developing the reservoir includes: determining, based on the in-situ fracture pore volume of the fracture, operating parameters for a well in the formation; and operating the well in accordance with the operating parameters.

Provided in some embodiments is a system for slice selective NMR testing of a fractured core plug. The system including: a slice selective NMR test fixture adapted to subject a fractured core plug to slice selective NMR scans; and non-transitory computer readable storage medium including program instructions executable by a computer processor to cause the following operations: identifying a location of a fracture within a core plug, the location including a position and orientation of the fracture, the core plug being saturated with a saturating fluid to introduce the saturating fluid into the fracture and being sealed to inhibit the saturating fluid from leaking out of the fracture; identifying a slice of the core plug corresponding to the location of the fracture; conducting initial local slice selective NMR testing of the core plug including: subjecting the core plug to baseline conditions, the baseline conditions including a first stress level; conducting an initial NMR scan of the core plug to acquire initial $T_2$ NMR measurements, the initial NMR scan of the core plug including an NMR scan of the slice of the core plug corresponding to the fracture while the core plug is subjected to the baseline conditions; and determining, based on the initial $T_2$ NMR measurements, an initial fracture pore volume of the fracture; conducting in-situ local slice selective NMR testing of the core plug including the following: determining in-situ conditions of the core plug, the in-situ conditions including an in-situ stress level for the core plug; subjecting the core plug to in-situ conditions including a second stress level that is greater than the first stress level and that corresponds to the in-situ stress level; conducting an in-situ NMR scan of the core plug to acquire in-situ $T_2$ NMR measurements, the in-situ NMR scan of the core plug including an NMR scan of the slice of the core plug corresponding to the fracture while the core plug is subjected to the in-situ conditions; measuring a volume of water expelled from the core plug in response to subjecting the core plug to the in-situ condition; determining, based on the in-situ $T_2$ NMR measurements, an in-situ fracture pore volume of the fracture; determining a difference between the initial fracture pore volume of the fracture and the in-situ fracture pore volume of the fracture; comparing the difference between the initial fracture pore volume of the fracture and the in-situ fracture pore volume of the fracture to the volume of water expelled; and verifying, based on the comparison of the difference between the initial fracture pore volume of the fracture and the in-situ fracture pore volume of the fracture to the volume of water expelled, the in-situ fracture pore volume of the fracture.

In some embodiments, identifying the location of the fracture within the core plug includes imaging the core plug to identify the location of the fracture within the core plug. In certain embodiments, the imaging includes x-ray imaging or magnetic resonance imaging (MRI) of the core plug. In some embodiments, the exterior of the fractured core plug is coated with wax or paraffin. In certain embodiments, the slice selective NMR test fixture includes a tri-axial NMR test fixture including a first gradient coil oriented in an x direction, a second gradient coil oriented in a y direction, and a third gradient coil oriented in a z direction, where the orientation of the fracture is oriented at an angle relative to two or more of the x, y and z directions, and where the NMR scans of the slice of the core plug each include selectively energizing two or more of the first, second and third gradient coils to obtain corresponding $T_2$ measurements for the slice. In certain embodiments, the in-situ conditions include a confining stress or shear stress that is greater than a confining stress or shear stress of the first stress level. In some embodiments, the in-situ conditions include an elevated in-situ stress level, and where the in-situ local slice selective NMR testing of the core plug includes iteratively increasing a stress level applied to the core plug to reach the elevated in-situ stress level, and, for each iteration of an increase of the stress level applied to the core plug, conducting an in-situ NMR scan of the core plug and measuring a volume of water expelled from the core plug. In certain embodiments, the core plug is extracted from a formation of a reservoir and the reservoir is developed based on the in-situ fracture pore volume of the fracture. In some embodiments, developing the reservoir includes: determining, based on the in-situ fracture pore volume of the fracture, operating parameters for a well in the formation; and operating the well in accordance with the operating parameters.

Figure 1:
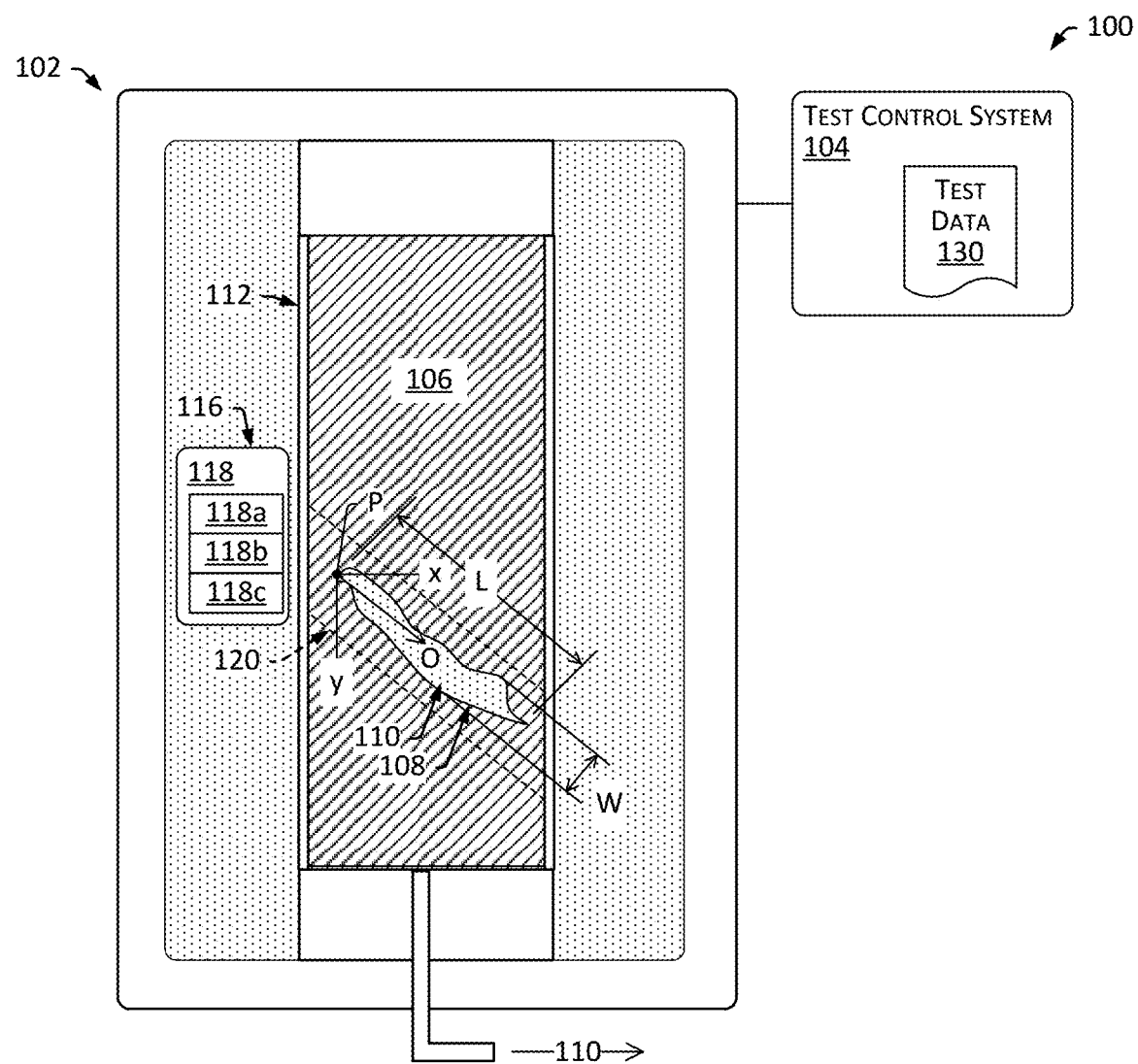
FIG. 1 is a diagram that illustrates a core plug assessment environment in accordance with one or more embodiments.

While this disclosure is susceptible to various modifications and alternative forms, specific embodiments are shown by way of example in the drawings and will be described in detail. The drawings may not be to scale. It should be understood that the drawings and the detailed descriptions are not intended to limit the disclosure to the particular form disclosed, but are intended to disclose modifications, equivalents, and alternatives falling within the scope of the present disclosure as defined by the claims.

DETAILED DESCRIPTION

Described are embodiments of systems and methods for determining in-situ fracture pore volume of fractured core plugs. Certain embodiments provide local slice selective $T_2$ nuclear magnetic resonance (NMR) testing of a saturated (or "flooded") core plug under in-situ conditions to determine an accurate measurement of a pore volume of a fracture in the core plug. The fracture pore volume may be used, for example, determine an in-situ fracture pore volume of the core plug or associated rock, such as rock of a reservoir from which the core plug is extracted, and the reservoir may be developed based on the in-situ fracture pore volume.

In some embodiments, a local slice selective $T_2$ NMR test procedure includes the following: (1) identifying a location of a fracture within a core plug; (2) conducting an initial local slice selective $T_2$ NMR test on a slice of the core plug that corresponds to the location of the fracture to generate initial $T_2$ measurements for the slice (for example, conducting a local slice selective $T_2$ NMR test on the slice of the core plug while the core plug is subjected to initial conditions to generate initial $T_2$ measurements for the slice); (3) determining an initial fracture pore volume of the fracture based on the initial $T_2$ measurements; (4) conducting an in-situ local slice selective $T_2$ NMR test on the slice of the core plug to generate in-situ $T_2$ measurements for the slice and corresponding measures of a volume of fluid expelled from the core plug (for example, conducting a local slice selective $T_2$ NMR test on the slice of the core plug while the core plug is subjected to in-situ conditions, such as elevated levels of confining pressure or shear stress, to generate in-situ $T_2$ measurements for the slice and measuring the volume of fluid expelled from the core plug as a result of subjecting the core to the in-situ conditions); (5) determining an in-situ fracture pore volume for the fracture based on the in-situ $T_2$ measurements; and (6) comparing the volume of water expelled to a difference between the initial fracture pore volume determined and the in-situ fracture pore volume determined to confirm the accuracy of the in-situ pore volume for the fracture determined.

FIG. 1 is a diagram that illustrates a core plug assessment environment ("environment") 100 in accordance with one or more embodiments. In some embodiments, the environment 100 includes a test fixture 102 and a test control system 104 that provide local slice selective $T_2$ nuclear magnetic resonance (NMR) testing of a saturated (or "flooded") core plug ("core") 106 to determine an accurate measurement of fracture pore volume of a fracture 108 within the core 106.

In some embodiments, the core 106 includes a sample of rock extracted from a subsurface geologic formation. For example, the core 106 may be a sample of rock extracted from a hydrocarbon reservoir located in a subsurface geologic formation. The core 106 may, for example, be extracted from the reservoir by way of a coring operation that includes, for example, using a coring bit to cut and extract the core 106 from a wellbore of a well that extends into the reservoir.

In some embodiments, the fracture 108 includes a crack, vugg or similar feature that defines a void in the rock of the core 106. The fracture 108 may be naturally occurring. For example, the fracture 108 may be a crack or vugg that is present in the core 106 in-situ. This may be, for example, a crack that was present when the core 106 was in place in the formation, before the core 106 was extracted from the formation. The fracture 108 may be artificially induced. For example, the fracture 108 may be created by sawing into the core 106 or by subjecting the core 106 to elevated stress levels to cause the fracture 108 to form. Elevated stress levels may include, for example, application of compressive stresses in a Brazilian split test or application of an elevated shear stress using a tri-axial load cell.

In some embodiments, the core 106 is saturated (or "flooded") with a fluid 110. For example, the core 106 may be subjected to a saturation operation that involves introducing fluid 110 into the fracture 108 and other voids within the core 106. In some embodiments, a saturation operation includes soaking the core 106 in the fluid 110. For example, a soaking saturation operation may include submersing the core 106 in a tub of the fluid 110 for eight to ten hours to allow the fluid 110 to permeate the fracture 108 and other voids within the core 106. A soaking type saturation operation may work well for cores that have a relatively high permeability or porosity. In some embodiments, a saturation operation includes injecting the fluid 110 into the core 106. For example, an injection saturation operation may include placing the core 106 into a pressure cell and operating the pressure cell to elevate the pressure of the fluid 110 around the core 106 to force the fluid 110 to permeate the fracture 108 and other voids within the core 106. An injection type saturation operation may work well for cores that have a relatively low permeability or porosity (sometimes referred to as "tight cores").

In some embodiments, the fluid 110 is water ($H_2O$) or brine. A brine may be used where the core 106 is determined to include clays or anhydrites. In such an instance, the brine may include a level of salt that inhibits clay swelling or anhydrite dissolution. In some embodiments, the fluid 110 has a temperature (for example, about 35 degrees Celsius (C)) that is the same as or similar to the temperature of an NMR relaxometer magnet (or "coil") used for the local slice selective $T_2$ NMR testing of the core 106.

In some embodiments, the statured core 106 is sealed to preserve fluid within the core 106. The seal may include a coating of the exterior of the saturated core 106 with a substance to seal in the saturating fluid 110 or otherwise inhibit the saturating fluid 110 from leaking out of the fracture 108 and the core 106. For example, the statured core 106 may be immersed in paraffin or wax. This may create a skin (or "jacket") 112 of paraffin or wax about the exterior of the saturated core 106 that seals the exterior of the core 106. This may inhibit the saturating fluid from leaking out of the fracture 108 and the core 106.

In some embodiments, the core 106 is examined to identify the fracture 108. This may include identifying a presence and location of the fracture 108. In some embodiments, the examination includes a visual inspection of the core 106. For example, a person may visually inspect the core 106 to determine the presence and location of the fracture 108. Visual inspection may be suitable for identifying fractures 108 that occur at an exterior surface of the core 106. In some embodiments, the examination includes an imaged based inspection of the core 106. An imaged based inspection of the core 106 may include, for example, X-ray imaging of the core 106 (for example, X-ray medical chromatography or micro chromatography scans), or magnetic resonance imaging (MRI) (for example, a three-dimensional (3D) MRI or single-point ramped imaging with $T_1$-enhancement (SPRITE) MM, spatial $T_2$ MRI, or Spin-Echo Single Point Imaging Technique (SE SPIT)) of the core 106, to generate images that are used to determine the location of the fracture 108. Imaged based inspection may be suitable for identifying fractures 108 that occur at an exterior surface of the core 106 or in the interior of the core 106 (which may not be apparent by visual inspection). The location of the fracture 108 may include a region defined by a position and orientation of the fracture 108. The region may be defined by a starting point (P), a length (L), a width (or height) (W) and an orientation (O) of the fracture 108. The orientation (O) may be defined by Euler angles $\alpha$, $\beta$, $\gamma$ relative to x, y and z axes respectively. The location of the fracture 108 may be used, for example, to define a region that contains the fracture 108 or a slice 120 that contains the region.

In some embodiments, the test fixture 102 includes a tri-axial NMR test fixture. The test fixture 102 may be capable of applying shearing stresses and normal ("confining") pressure/stresses to the saturated core 106 while conducting local slice selective $T_2$ NMR testing of the saturated core 106. In some embodiments, the test fixture 102 includes multiple gradient coils 118 that enable flexibility in selecting the orientation of a selected slice 120 of the core 106 to be subjected to $T_2$ NMR testing. For example, the test fixture 102 may include a tri-axial NMR test fixture having a NMR relaxometer 116 having three gradient coils 118 (including coils 118a, 118b and 118c), oriented in the x, y and z directions, respectively. The coils 118 may be employed individually or in combination to obtain $T_2$ measurements for different orientations (for example, for x, y, z, xy, xz, yz, and xyz orientations). During testing, of a core 106 having a fracture 108 in a given orientation, the coils 118 may be employed individually or in combination to obtain $T_2$ measurements for a slice 120 at the orientation of the fracture 108. This may enable a focused an efficient assessment of the fracture 108 (for example, acquiring $T_2$ measurements for a single slice 120 that contains the fracture 108) without having to assess other regions of the core 106 that are not of interest. This can save cost and time associated with assessing the core 106. For example, the ability to conduct $T_2$ NMR testing of a single slice 120 having the orientation (O) of an elongated fracture 108 may prevent having to obtain measurements for multiple slices (for example, oriented orthogonal to an elongated fracture 108) which can save the time and cost with $T_2$ NMR testing of a multiple slices, and can save the time and cost associated with saturating other regions of the core 106 that are not of interest.

The test control system ("control system") 104 may provide for control of local slice selective $T_2$ NMR testing of the saturated core 106, including collecting resulting $T_2$ NMR test data (also referred to simply as "test data") 130, processing of the test data 130, or developing the reservoir based on the test data 130. For example, the control system 104 may control the test fixture 102 to conduct the local slice selective $T_2$ NMR testing of the saturated core 106, to collect and process test data 130 that includes $T_2$ measurements and expelled volumes of the saturating fluid 110 for different test conditions (for example, room and in-situ conditions), to process the test data 130 to determine and verify a pore volume (or "fracture pore volume") of the fracture 108, or may control drilling, completion or production operations for a well in a reservoir from which the core 106 was extracted based on the fracture pore volume of the fracture 108. For example, the control system 104 may determine a porosity of the reservoir based on the fracture pore volume for the fracture 108, may determine operating parameters for a well, such as injection rates or pressures (or production rates or pressures), based on the pore volume, and may control a well in the reservoir (for example, the well from which the core 106 was extracted) according to the parameters, such as operating the well at the injection rates or pressures (or production rates or pressures).

In some embodiments, a local slice selective $T_2$ NMR test includes the following: (1) identifying a location (including position and orientation) of the fracture 108 within the core 106; (2) conducting an initial local slice selective $T_2$ NMR test on the slice 120 of the core 106 that corresponds to the location of the fracture 108 to generate initial $T_2$ measurements for the slice 120 (for example, conducting a local slice selective $T_2$ NMR test on the saturated core 106 while it is subjected to initial (or "baseline" or "room") conditions to generate initial (or "baseline" or "room") $T_2$ measurements for the slice 120); (3) determining an initial fracture pore volume (Vo) of the fracture 108 based on the initial $T_2$ measurements; (4) conducting an in-situ local slice selective $T_2$ NMR test on the slice 120 of the core 106 to generate in-situ $T_2$ measurements for the slice 120 and corresponding measures of the fluid 110 expelled from the core 106 (for example, conducting a local slice selective $T_2$ NMR test on the slice 120 of the core 106 saturated with fluid 110 while it is subjected to in-situ conditions, such as elevated levels of stress, to generate in-situ $T_2$ measurements for the slice 120 and measuring the volume of fluid 110 expelled ($V_f$) from the core 106 as a result of subjecting the core 106 to the in-situ conditions); (5) determining an in-situ fracture pore volume (Vi) for the fracture 108 based on the in-situ $T_2$ measurements; and (6) comparing the volume of fluid 110 expelled ($V_f$) to a difference between the initial fracture pore volume (Vo) and the in-situ fracture pore volume (Vi) to confirm the accuracy of the determined in-situ fracture pore volume (Vi) for the fracture 108.

Figure 2:
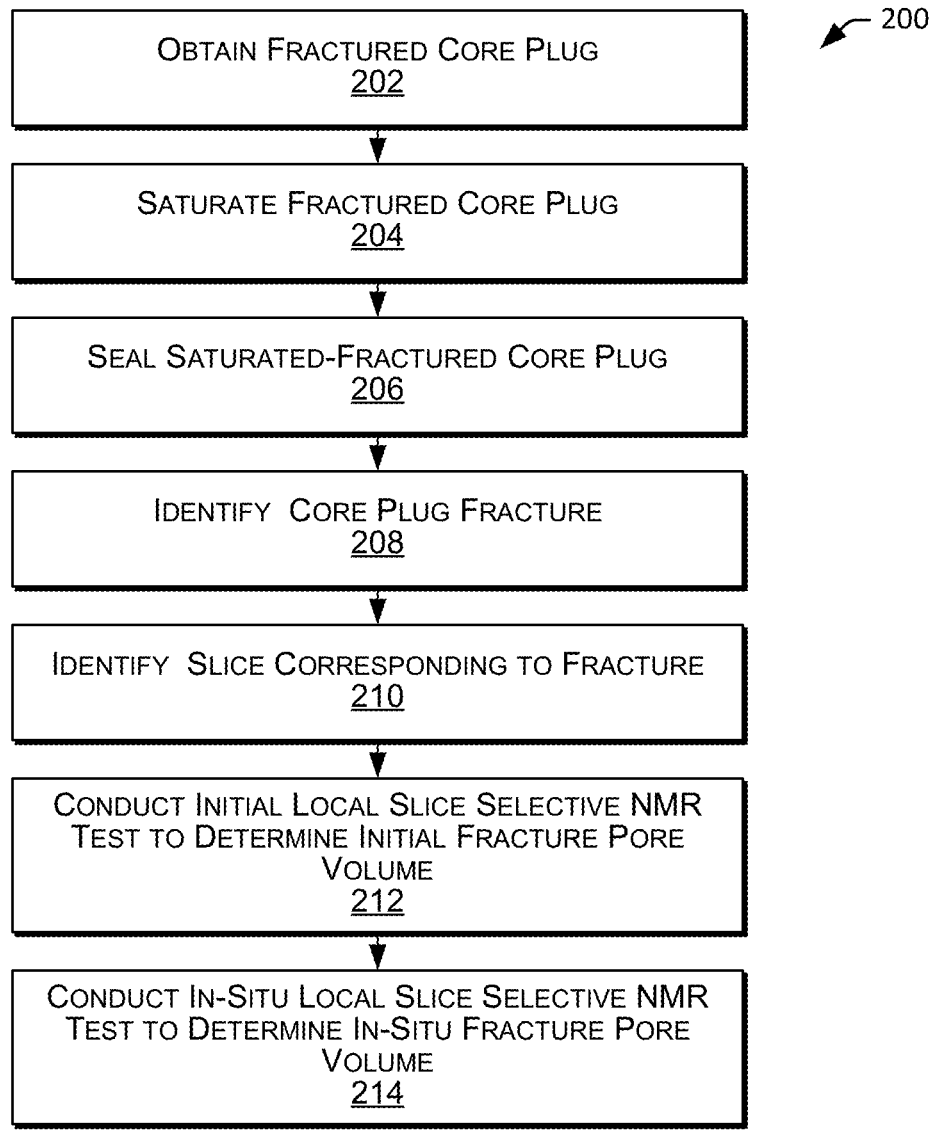
FIG. 2 is a flowchart diagram that illustrates a method of local slice selective $T_2$ NMR testing of a saturated core plug in accordance with one or more embodiments.

FIG. 2 is a flowchart diagram that illustrates an example method 200 of local slice selective $T_2$ NMR testing of a saturated (or "flooded") core in accordance with one or more embodiments. In the context of the environment 100, the operational aspects of method 200 may be performed or controlled, for example, by the control system 104 or another operator of the environment 100.

In some embodiments, method 200 includes obtaining a fractured core plug (block 202). Obtaining a fractured core plug may include obtaining, for example, by way of a coring operation, a core plug having vuggs or fractures. In some embodiments, obtaining a fractured core plug includes obtaining the core 106 having the fracture 108. For example, a coring operation may be performed to cut and extract the core 106 having the fracture 108 (or the "fractured core" 106) from a wellbore extending into a reservoir of a rock formation. The core 106 may be, for example, a cylindrical sample of the rock of the formation that is extracted from its original (or "in situ") location in the reservoir. The fracture may be naturally occurring or artificially induced. For example, the fracture 108 may be a naturally occurring crack in the rock of the core 106 that is present in-situ, or may be artificially induced by way of sawing or application of elevated stresses.

In some embodiments, method 200 includes saturating the fractured core plug (block 204). Saturating the fractured core plug may include saturating the fractured core plug with a fluid to fill the fracture with the fluid. In some embodiments, saturating the fractured core plug includes saturating the core 106 with a fluid to fill the fracture 108 with the fluid. For example, the core 106 may be subjected to a soaking operation that includes submersing the core 106 into fluid 110 for eight to ten hours to allow the fluid 110 to permeate the fracture 108 and other voids within the core 106. As another example, the core 106 may be subjected to an injection operation that incudes include placing the core 106 into a pressure cell and operating the pressure cell to elevate the pressure of the fluid 110 around the core 106 to force the fluid 110 to permeate the fracture 108 and other voids within the core 106. In some embodiments, the fluid 110 is water ($H_2O$) or brine. In some embodiments, the fluid 110 has a temperature that is the same as or similar to the temperature of an NMR relaxometer magnet used for the local slice selective $T_2$ NMR testing of the core 106, which may be about 35 degrees Celsius (C).

In some embodiments, method 200 includes sealing the saturated-fractured core plug (block 206). Sealing the saturated-fractured core plug may include coating an exterior of the saturated-fractured core plug to preserve the saturating fluid within the core. In some embodiments, sealing the saturated-fractured core plug includes sealing the saturated core 106 to preserve the saturating fluid 110 (for example, water or brine) within the core 106. For example, the statured core 106 may be immersed in paraffin or wax. This may create the skin 112 about the exterior of the core 106 that inhibits that saturating fluid 110 from leaking out of the fracture 108 and the core 106.

In some embodiments, method 200 includes identifying a fracture of the saturated-fractured core plug (block 208). Identifying a fracture of the saturated-fractured core plug may include identifying a location (including a position and orientation) of a fracture within the core plug. In some embodiments, identifying a fracture of the saturated-fractured core plug may include identifying a location (including a position and orientation) of the fracture 108 within the core 106. This may include, for example, a visual or image based inspection of the core 106 to determine the position and orientation of the fracture 108. The position of the fracture 108 may include identification of a starting point, a length, and a width. The starting point, length, width, and orientation may be used, for example, to define a region or slice 120 that contains the fracture 108.

In some embodiments, method 200 includes identifying a slice corresponding to the fracture (block 210). Identifying a slice corresponding to the fracture may include identifying a region and corresponding slice that contains the fracture. In some embodiments, identifying a slice corresponding to the fracture includes identifying a slice 120 that corresponds to a region that contains the fracture 108 of the core 106. A region and slice 120 may be identified based on the position (for example, the starting point, length and width) and orientation of the fracture. For example, where the fracture 108 is determined to start at a given point (P=$x_1$, $y_1$, $z_1$), have a given length (L), a given width (W) and a given orientation (O=$\alpha_1$, $\beta_1$, $\gamma_1$), a region that defines the extents of the fracture 108 (for example, a corresponding cylinder) may be identified, and a slice 120 that contains the region may be identified. The slice 120 may not contain the entirety of the core 106. For example, the slice 120 may encompass less than one-half, less than one quarter, less than one tenth, or less than one one-hundredth, of the volume or cross-section of the core 106. The slice may have the given orientation. For example, the slice 120 may have an orientation that is the same as the given orientation (O) of the fracture 108 or within ten, five or one degree of the given orientation (O) of the fracture 108. In some embodiments, the slice 120 is identified while the core 106 is loaded in the test fixture used to conduct the subsequent local slice selective $T_2$ NMR testing of the saturated-fractured core plug. For example, the core 106 may be loaded into the test fixture 102 (for example, a tri-axial NMR test fixture), the location of the fracture 108 with the core 106 loaded into the test fixture 102 may be determined, and the corresponding slice 120 may be determined based on the location of the fracture 108 with the core 106 loaded into the test fixture 102.

In some embodiments, method 200 includes conducting initial local slice selective NMR testing to determine an initial fracture pore volume (block 212). Conducting initial local slice selective NMR testing to determine an initial fracture pore volume may include controlling a test fixture to conduct a NMR scan of the slice corresponding to the fracture to generate $T_2$ NMR test data indicative of the volume of fluid contained in the fracture of the saturated-fractured core that can be used to determine an initial (or "baseline") fracture pore volume of the fracture. For example, conducting initial local slice selective NMR testing to determine an initial fracture pore volume may include controlling the test fixture 102 (for example, a tri-axial NMR test fixture) to conduct a NMR scan of the slice 120 corresponding to the fracture 108, to generate "initial" (or "baseline") $T_2$ NMR test data 130 that is indicative of the volume of fluid contained in the fracture 108 of the saturated core 106 which can be used to determine an initial fracture pore volume (Vo) (for example, 11.0 milliliters (ml)) of the fracture 108. The initial local slice selective NMR testing may be performed at room (or "initial" or "baseline") conditions (for example, at 35 degrees C. and without application of in-situ conditions, such as elevated stress levels). Conducting an NMR scan of a slice corresponding to a fracture may include selectively energizing (or "activating") gradient coils of a NMR relaxometer of a tri-axial NMR test fixture (individually or in combination) to obtain $T_2$ measurements for the slice. For example, where the slice 120 has an orientation (O) in the x and y directions, the NMR relaxometer 116 of a tri-axial NMR test fixture 102 having gradient coils 118 in the x, y and z directions may be positioned near the location of the fracture 108, and the x and y gradient coils 118a and 118b may be activated to selectively subject the slice 120 to NMR signals to obtain $T_2$ measurements for the slice 120.

In some embodiments, method 200 includes conducting in-situ local slice selective NMR testing to determine an in-situ fracture pore volume (block 214). Conducting in-situ local slice selective NMR testing to determine an in-situ fracture pore volume may include controlling the test fixture to conduct an NMR scan of the slice corresponding to the fracture while the saturated-fractured core is subjected to in-situ conditions (for example, elevated confining or shear stresses), to generate $T_2$ NMR test data indicative of the volume of fluid contained in the fracture of the saturated-fractured core under in-situ conditions which can be used to determine an in-situ (or "in place") fracture pore volume of the fracture. For example, conducting in-situ local slice selective NMR testing to determine an initial fracture pore volume may include controlling the test fixture 102 (for example, a tri-axial NMR test fixture) to subject the core 106 to in-situ conditions (for example, elevated levels of confining or shear stress) and conduct a NMR scan of the slice 120 corresponding to the fracture 108 while the core 106 is subjected to the in-situ conditions to generate "in-situ" $T_2$ NMR test data 130 that is indicative of the volume of fluid contained in the fracture 108 of the saturated core 106 under in-situ conditions. This may be used to determine an in-situ fracture pore volume (Vi) (for example, 7.0 milliliters (ml)) of the fracture 108.

In some embodiments, the volume of fluid expelled from the statured-fractured core is measured and is used to verify the accuracy of the in-situ fracture pore volume. For example, as the statured core 106 is exposed to in-situ conditions (for example, including an iterative increase in confining pressure or shear stress to reach the in-situ conditions), the saturating fluid 110 may flow out of the core 106 it is compressed (or "squeezed") and the fracture 108 decreases in volume. The expelled fluid 110 may be collected and its volume ($V_f$) measured to determine an "actual" change in pore volume (for example, 3.9 ml). The in-situ fracture pore volume (Vi) (for example, 7.0 ml) may be subtracted from the initial fracture pore volume (Vo) (for example, 11.0 ml) to determine an "estimated" change in pore volume ($\Delta V$) (for example, 4.0 ml), and the actual and estimated changes in pore volume may be compared to verify the results of the testing. In some embodiments, the results of the testing (for example, the determined in-situ fracture pore volume (Vi)) may be verified if the actual and estimated changes in pore volume are within a threshold value of one another (for example, within 10% of one another). For example, the in-situ fracture pore volume (Vi) of 4.0 ml may be determined to be within 2.6% of the 3.9 ml actual change in pore volume (for example, 4.0-3.9/3.9=0.026), and thus the in-situ fracture pore volume (Vi) may be verified based on it being within 10% of the actual change in pore volume ($V_f$).

In some embodiments, the in-situ local slice selective NMR testing includes iterative increases in respective conditions to reach in-situ conditions, and conducting an NMR scan of the slice at some or all of the iterations. For example, where the in-situ conditions include a confining pressure of 1,000 pounds-per square inch (psi) and a shear stress of 1,000 pounds per square foot (lb/ft$^2$), the in-situ local slice selective NMR testing may include a first iteration that includes an NMR scan of the slice 120 with the core 106 subjected to a confining pressure of 100 psi and a shear stress of 0 lb/ft$^2$, a second iteration that includes an NMR scan of the slice 120 with the core 106 subjected to a confining pressure of 100 psi and a shear stress of 100 lb/ft$^2$, a third iteration that includes an NMR scan of the slice 120 with the core 106 subjected to a confining pressure of 200 psi and a shear stress of 100 lb/ft$^2$, and so forth, until a last iteration that includes an NMR scan of the slice 120 with the core 106 subjected to a confining pressure of 1,000 psi and a shear stress of 1,000 lb/ft$^2$. A corresponding sub-set of test data 130 may be generated for each iteration and its respective combination of conditions. The sub-sets of data may be plotted to provide an indication of the change in pore volume across the combinations of conditions to reach the in-situ conditions. Although embodiments are discussed with regard to variations in confining pressure and shear stress for the purpose of explanation, embodiments can include variations in other parameters. For example, the in-situ conditions may include an elevated temperature. The in-situ conditions may correspond to the in-situ conditions of the formation and location from which the core was extracted.

Figure 3:
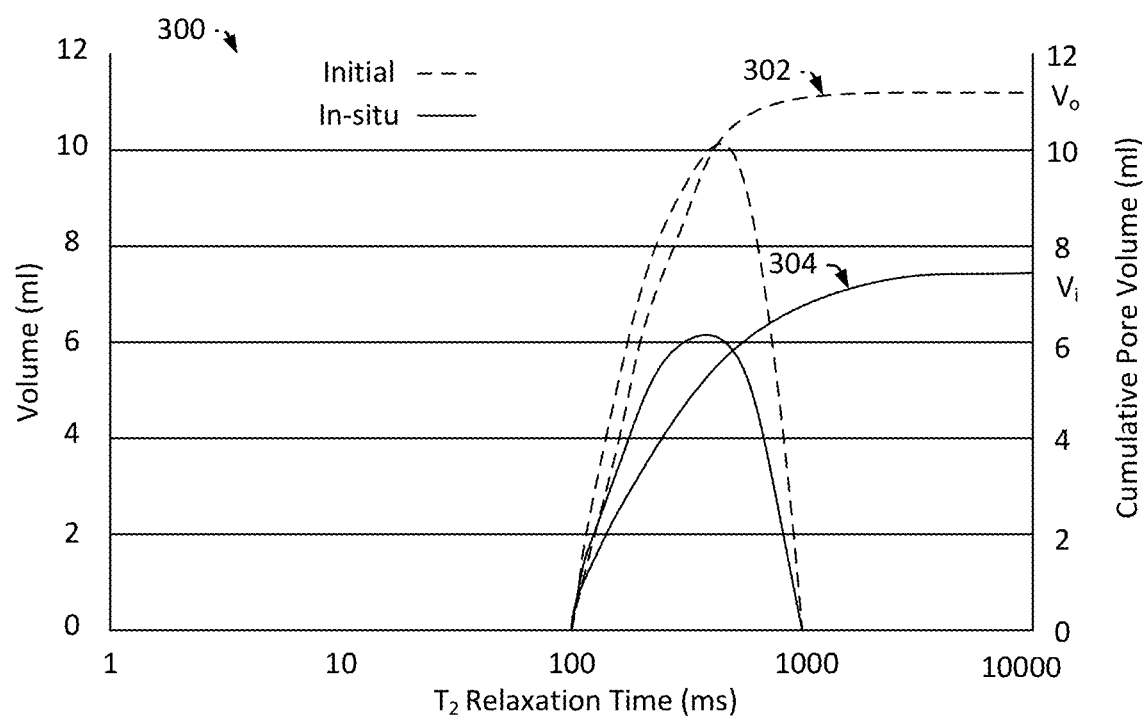
FIG. 3 is a plot diagram that illustrates example results of in-situ local slice selective $T_2$ NMR testing in accordance with one or more embodiments.

FIG. 3 is a plot diagram 300 that illustrates example results of in-situ local slice selective NMR testing in accordance with one or more embodiments. The illustrated embodiment includes a first curve 302 that represents cumulative fracture pore volume of a core under "room" conditions (for example, confining pressure of 0 psi and a shear stress of 0 lb/ft$^2$), and a second curve 304 that represents cumulative fracture pore volume of the core under "in-situ" conditions (for example, a confining pressure of 1,000 psi and a shear stress of 1,000 lb/ft$^2$). The difference between the maximum values of cumulative fracture pore volume may be considered the estimated change in fracture pore volume for the respective condition. For example, the first and second curves 302 and 304 have maximum values of about 11 ml and 7 ml, respectively, which is indicative of a change of about 4 ml in fracture pore volume for the fracture 108 between room and in-situ conditions.

Figure 4:
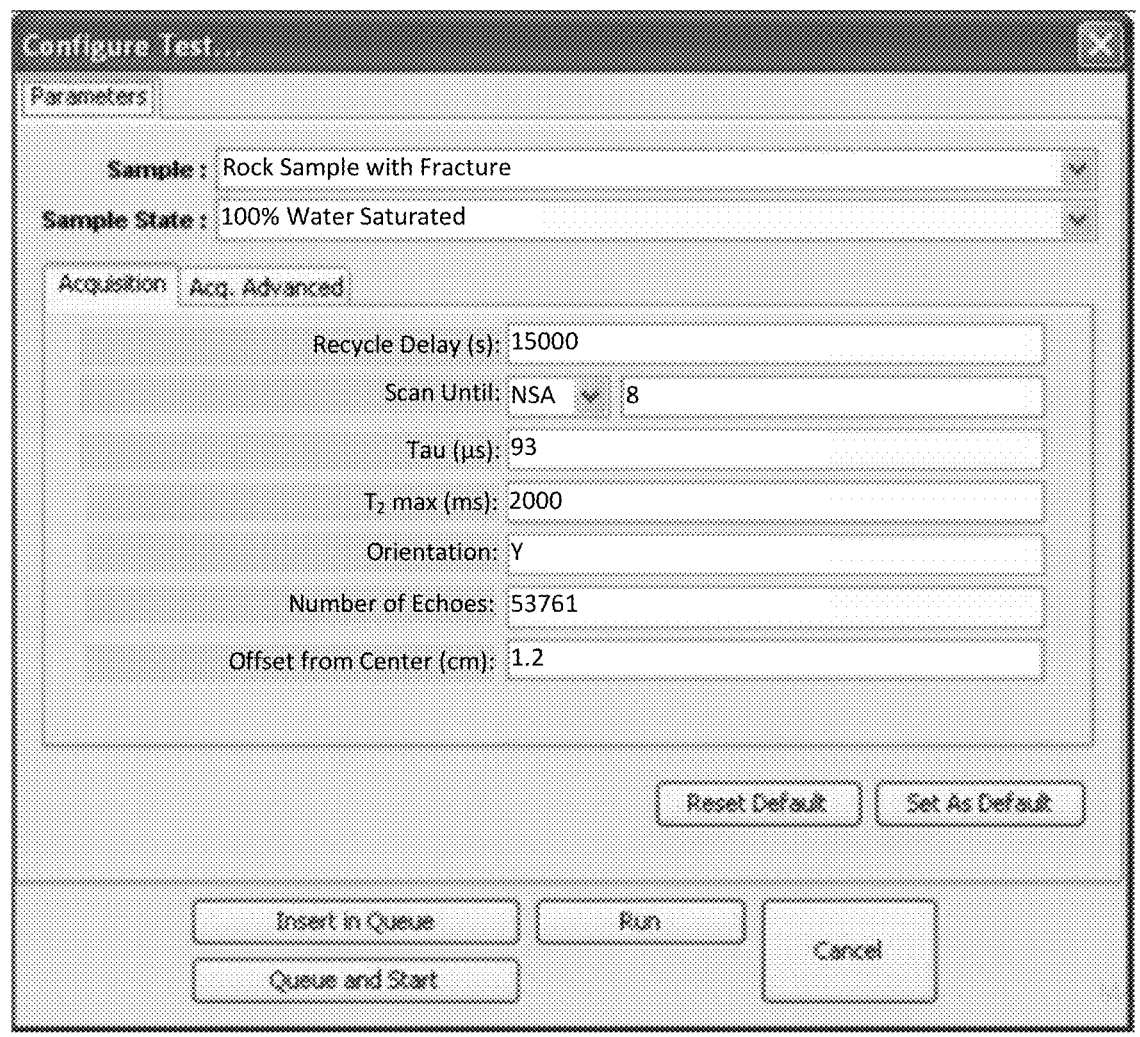
FIG. 4 is a diagram that illustrates example settings for an in-situ local slice selective $T_2$ NMR test in accordance with one or more embodiments

FIG. 4 is a diagram that illustrates example test settings for an in-situ local slice selective NMR test in accordance with one or more embodiments. The settings are summarized as follows:

Recycle Delay: The recycle delay may be calculated automatically.

Scan Until: The criteria used to stop the test. It may be by Number of Scans (NSA), Signal Noise ratio (SNR) or Time. Since Signal Noise (Quality of signal peak) is proportional to the square root of the number of scan, the NSA ma be chosen as a power of 2. For the SNR, a target of 100 or above may be considered a good quality.

Tau: The time between the 90-degree pulse and the first acquired echo.

$T_2$ Max: The maximum expected $T_2$ in the sample. For Porous materials saturated with water, a value of around 1000 may be enough to include surface and bulk $T_2$ relaxation in the sample.

Orientation (or "Imaging Plane" or "Slice orientation"): A specified orientation of the slice. The imaging plane is dependent on the number of gradient coils in the NMR relaxometer hardware. The NMR relaxometer may be configured with three different imaging planes (for example, using its three gradient coils), which makes it possible to change the slice orientation to a given direction/direction (for example, x, y or z) or to a combination of directions, (for example, in the xy, xz or yz directions/planes) to position the slice along the fracture direction.

Number of Echoes: A read-only field showing how many echoes will be acquired. $T_2$ Max and tau may be used to compute the number of echoes required (for example, the number of echoes=5*$T_2$ Max/(2*tau)).

Offset from Center: A selected offset of the slice from the zero point of the chosen orientation. Zero may be the center of the magnet/coil, and positive and negative values are used to move the slice off center. This may be adjusted to position the slice at the fracture location.

Figure 5:
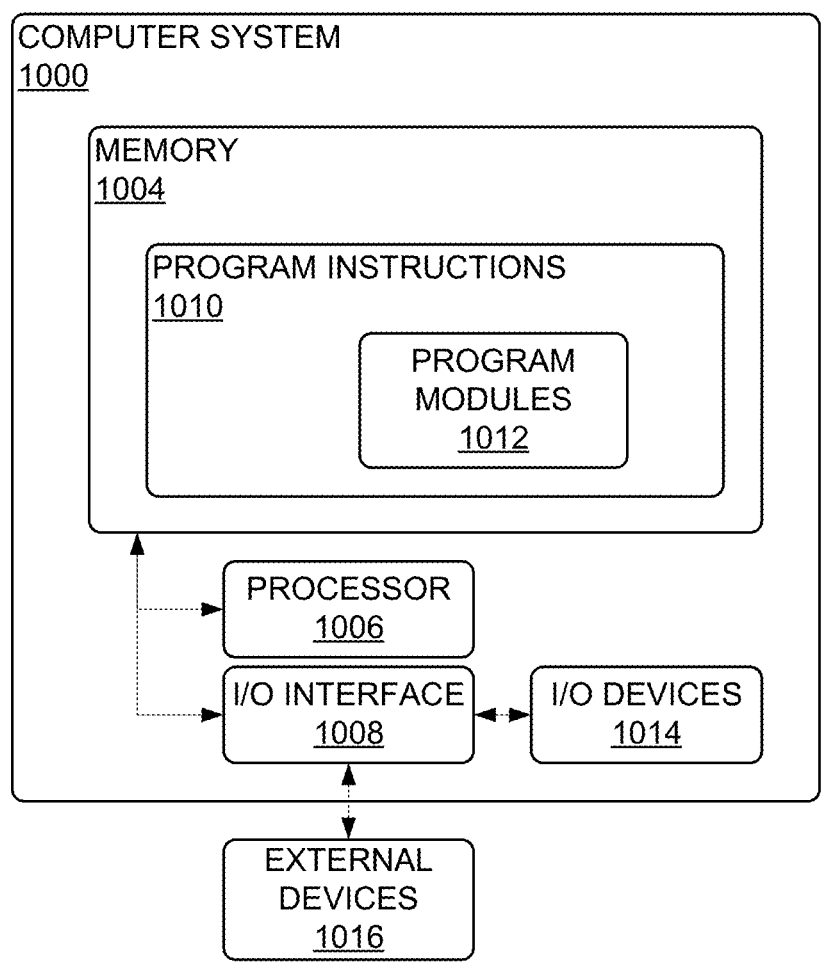
FIG. 5 is a diagram that illustrates an example computer system in accordance with one or more embodiments.

FIG. 5 is a diagram that illustrates an example computer system (or "system") 1000 in accordance with one or more embodiments. In some embodiments, the system 1000 is a programmable logic controller (PLC). The system 1000 may include a memory 1004, a processor 1006 and an input/output (I/O) interface 1008. The memory 1004 may include non-volatile memory (for example, flash memory, read-only memory (ROM), programmable read-only memory (PROM), erasable programmable read-only memory (EPROM), electrically erasable programmable read-only memory (EEPROM)), volatile memory (for example, random access memory (RAM), static random access memory (SRAM), synchronous dynamic RAM (SDRAM)), or bulk storage memory (for example, CD-ROM or DVD-ROM, hard drives). The memory 1004 may include a non-transitory computer-readable storage medium having program instructions 1010 stored thereon. The program instructions 1010 may include program modules 1012 that are executable by a computer processor (for example, the processor 1006) to cause the functional operations described, such as those described with regard to the method 200 or the control system 104 (or another operator of the environment 100).

The processor 1006 may be any suitable processor capable of executing program instructions. The processor 1006 may include a central processing unit (CPU) that carries out program instructions (for example, the program instructions of the program modules 1012) to perform the arithmetical, logical, or input/output operations described. The processor 1006 may include one or more processors. The I/O interface 1008 may provide an interface for communication with one or more I/O devices 1014, such as a joystick, a computer mouse, a keyboard, or a display screen (for example, an electronic display for displaying a graphical user interface (GUI)). The I/O devices 1014 may include one or more of the user input devices. The I/O devices 1014 may be connected to the I/O interface 1008 by way of a wired connection (for example, an Industrial Ethernet connection) or a wireless connection (for example, a Wi-Fi connection). The I/O interface 1008 may provide an interface for communication with one or more external devices 1016. In some embodiments, the I/O interface 1008 includes one or both of an antenna and a transceiver. In some embodiments, the external devices 1016 include the test fixture 102.

Further modifications and alternative embodiments of various aspects of the disclosure will be apparent to those skilled in the art in view of this description. Accordingly, this description is to be construed as illustrative only and is for the purpose of teaching those skilled in the art the general manner of carrying out the embodiments. It is to be understood that the forms of the embodiments shown and described here are to be taken as examples of embodiments. Elements and materials may be substituted for those illustrated and described here, parts and processes may be reversed or omitted, and certain features of the embodiments may be utilized independently, all as would be apparent to one skilled in the art after having the benefit of this description of the embodiments. Changes may be made in the elements described here without departing from the spirit and scope of the embodiments as described in the following claims. Headings used here are for organizational purposes only and are not meant to be used to limit the scope of the description.

It will be appreciated that the processes and methods described here are example embodiments of processes and methods that may be employed in accordance with the techniques described here. The processes and methods may be modified to facilitate variations of their implementation and use. The order of the processes and methods and the operations provided may be changed, and various elements may be added, reordered, combined, omitted, modified, and so forth. Portions of the processes and methods may be implemented in software, hardware, or a combination of software and hardware. Some or all of the portions of the processes and methods may be implemented by one or more of the processors/modules/applications described here.

As used throughout this application, the word "may" is used in a permissive sense (that is, meaning having the potential to), rather than the mandatory sense (that is, meaning must). The words "include," "including," and "includes" mean including, but not limited to. As used throughout this application, the singular forms "a", "an," and "the" include plural referents unless the content clearly indicates otherwise. Thus, for example, reference to "an element" may include a combination of two or more elements. As used throughout this application, the term "or" is used in an inclusive sense, unless indicated otherwise. That is, a description of an element including A or B may refer to the element including one or both of A and B. As used throughout this application, the phrase "based on" does not limit the associated operation to being solely based on a particular item. Thus, for example, processing "based on" data A may include processing based at least in part on data A and based at least in part on data B, unless the content clearly indicates otherwise. As used throughout this application, the term "from" does not limit the associated operation to being directly from. Thus, for example, receiving an item "from" an entity may include receiving an item directly from the entity or indirectly from the entity (for example, by way of an intermediary entity). Unless specifically stated otherwise, as apparent from the discussion, it is appreciated that throughout this specification discussions utilizing terms such as "processing," "computing," "calculating," "determining," or the like refer to actions or processes of a specific apparatus, such as a special purpose computer or a similar special purpose electronic processing/computing device. In the context of this specification, a special purpose computer or a similar special purpose electronic processing/computing device is capable of manipulating or transforming signals, typically represented as physical, electronic or magnetic quantities within memories, registers, or other information storage devices, transmission devices, or display devices of the special purpose computer or similar special purpose electronic processing/computing device.

What is claimed is:

1. A method of slice selective nuclear magnetic resonance (NMR) testing of a fractured core plug, the method comprising:

obtaining a fractured core plug comprising a fracture;

saturating the fractured core plug with a saturating fluid to introduce the saturating fluid into the fracture;

sealing the fractured core plug to inhibit the saturating fluid from leaking out of the fracture;

identifying a location of the fracture within the core plug, the location including a position and orientation of the fracture;

identifying a slice of the core plug corresponding to the location of the fracture;

conducting initial local slice selective NMR testing of the core plug comprising:

subjecting the core plug to baseline conditions, the baseline conditions comprising a first stress level;

conducting an initial NMR scan of the core plug to acquire initial $T_2$ NMR measurements, the initial NMR scan of the core plug comprising an NMR scan of the slice of the core plug corresponding to the fracture while the core plug is subjected to the baseline conditions; and determining, based on the initial $T_2$ NMR measurements, an initial fracture pore volume of the fracture;

conducting in-situ local slice selective NMR testing of the core plug comprising:

determining in-situ conditions of the core plug, the in-situ conditions comprising an in-situ stress level for the core plug;

subjecting the core plug to in-situ conditions comprising a second stress level that is greater than the first stress level and that corresponds to the in-situ stress level;

conducting an in-situ NMR scan of the core plug to acquire in-situ $T_2$ NMR measurements, the in-situ NMR scan of the core plug comprising an NMR scan of the slice of the core plug corresponding to the fracture while the core plug is subjected to the in-situ conditions;

measuring a volume of water expelled from the core plug in response to subjecting the core plug to the in-situ condition;

determining, based on the in-situ $T_2$ NMR measurements, an in-situ fracture pore volume of the fracture;

determining a difference between the initial fracture pore volume of the fracture and the in-situ fracture pore volume of the fracture;

comparing the difference between the initial fracture pore volume of the fracture and the in-situ fracture pore volume of the fracture to the volume of water expelled; and verifying, based on the comparison of the difference between the initial fracture pore volume of the fracture and the in-situ fracture pore volume of the fracture to the volume of water expelled, the in-situ fracture pore volume of the fracture.

2. The method of claim 1, wherein identifying the location of the fracture within the core plug comprises imaging the core plug to identify the location of the fracture within the core plug.

3. The method of claim 2, wherein the imaging comprises x-ray imaging or magnetic resonance imaging (MRI) of the core plug.

4. The method of claim 1, wherein sealing the fractured core plug comprises coating the fractured core plug with wax or paraffin.

5. The method of claim 1, wherein the in-situ local slice selective NMR testing of the core plug is conducted using a tri-axial NMR test fixture comprising a first gradient coil oriented in an x direction, a second gradient coil oriented in a y direction, and a third gradient coil oriented in a z direction, wherein the orientation of the fracture is oriented at an angle relative to two or more of the x, y and z directions, and wherein the NMR scans of the slice of the core plug each comprise selectively energizing two or more of the first, second and third gradient coils to obtain corresponding ones of the in-situ $T_2$ measurements for the slice.

6. The method of claim 1, wherein the in-situ conditions comprise a confining stress or shear stress that is greater than a confining stress or shear stress of the first stress level.

7. The method claim 1, wherein the in-situ conditions comprise an elevated in-situ stress level, and wherein the in-situ local slice selective NMR testing of the core plug comprises iteratively increasing a stress level applied to the core plug to reach the elevated in-situ stress level, and, for each iteration of an increase of the stress level applied to the core plug, conducting an in-situ NMR scan of the core plug and measuring a volume of water expelled from the core plug.

8. The method of claim 1, wherein the core plug is extracted from a formation of a reservoir and the method further comprises developing the reservoir based on the in-situ fracture pore volume of the fracture.

9. The method of claim 8, wherein developing the reservoir comprises:

determining, based on the in-situ fracture pore volume of the fracture, operating parameters for a well in the formation; and operating the well in accordance with the operating parameters.

10. A non-transitory computer readable storage medium comprising program instructions for slice selective nuclear magnetic resonance (NMR) testing of a fractured core plug, the program instructions executable by a computer processor to cause the following operations:

identifying a location of a fracture within a core plug, the location including a position and orientation of the fracture, the core plug being saturated with a saturating fluid to introduce the saturating fluid into the fracture and being sealed to inhibit the saturating fluid from leaking out of the fracture;

identifying a slice of the core plug corresponding to the location of the fracture;

conducting initial local slice selective NMR testing of the core plug comprising:
   subjecting the core plug to baseline conditions, the baseline conditions comprising a first stress level;
   conducting an initial NMR scan of the core plug to acquire initial $T_2$ NMR measurements, the initial NMR scan of the core plug comprising an NMR scan of the slice of the core plug corresponding to the fracture while the core plug is subjected to the baseline conditions; and
   determining, based on the initial $T_2$ NMR measurements, an initial fracture pore volume of the fracture;

conducting in-situ local slice selective NMR testing of the core plug comprising:
   determining in-situ conditions of the core plug, the in-situ conditions comprising an in-situ stress level for the core plug;
   subjecting the core plug to in-situ conditions comprising a second stress level that is greater than the first stress level and that corresponds to the in-situ stress level;
   conducting an in-situ NMR scan of the core plug to acquire in-situ $T_2$ NMR measurements, the in-situ NMR scan of the core plug comprising an NMR scan of the slice of the core plug corresponding to the fracture while the core plug is subjected to the in-situ conditions;
   measuring a volume of water expelled from the core plug in response to subjecting the core plug to the in-situ condition;
   determining, based on the in-situ $T_2$ NMR measurements, an in-situ fracture pore volume of the fracture;
   determining a difference between the initial fracture pore volume of the fracture and the in-situ fracture pore volume of the fracture;
   comparing the difference between the initial fracture pore volume of the fracture and the in-situ fracture pore volume of the fracture to the volume of water expelled; and
   verifying, based on the comparison of the difference between the initial fracture pore volume of the fracture and the in-situ fracture pore volume of the fracture to the volume of water expelled, the in-situ fracture pore volume of the fracture.

11. The medium of claim 10, wherein identifying the location of the fracture within the core plug comprises imaging the core plug to identify the location of the fracture within the core plug.

12. The medium of claim 11, wherein the imaging comprises x-ray imaging or magnetic resonance imaging (MRI) of the core plug.

13. The medium of claim 10, wherein the exterior of the fractured core plug is coated with wax or paraffin configured to provide for the core plug being sealed to inhibit the saturating fluid from leaking out of the fracture.

14. The medium of claim 10, wherein the in-situ local slice selective NMR testing of the core plug is conducted using a tri-axial NMR test fixture comprising a first gradient coil oriented in an x direction, a second gradient coil oriented in a y direction, and a third gradient coil oriented in a z direction, wherein the orientation of the fracture is oriented at an angle relative to two or more of the x, y and z directions, and wherein the NMR scans of the slice of the core plug each comprise selectively energizing two or more of the first gradient coil, the second gradient coil and third gradient coils to obtain corresponding ones of the in-situ $T_2$ measurements for the slice.

15. The medium of claim 10, wherein the in-situ conditions comprise a confining stress or shear stress that is greater than a confining stress or shear stress of the first stress level.

16. The medium of claim 10, wherein the in-situ conditions comprise an elevated in-situ stress level, and wherein the in-situ local slice selective NMR testing of the core plug comprises iteratively increasing a stress level applied to the core plug to reach the elevated in-situ stress level, and, for each iteration of an increase of the stress level applied to the core plug, conducting an in-situ NMR scan of the core plug and measuring a volume of water expelled from the core plug.

17. The medium of claim 10, wherein the core plug is extracted from a formation of a reservoir and the reservoir is developed based on the in-situ fracture pore volume of the fracture.

18. The medium of claim 17, wherein developing the reservoir comprises:
   determining, based on the in-situ fracture pore volume of the fracture, operating parameters for a well in the formation; and
   operating the well in accordance with the operating parameters.

19. A system for slice selective nuclear magnetic resonance (NMR) testing of a fractured core plug, comprising:
   a slice selective NMR test fixture configured to subject a fractured core plug to slice selective NMR scans; and
   non-transitory computer readable storage medium comprising program instructions executable by a computer processor to cause the following operations:
      identifying a location of a fracture within a core plug, the location including a position and orientation of the fracture, the core plug being saturated with a saturating fluid to introduce the saturating fluid into the fracture and being sealed to inhibit the saturating fluid from leaking out of the fracture;
      identifying a slice of the core plug corresponding to the location of the fracture;
      conducting initial local slice selective NMR testing of the core plug comprising:
         subjecting the core plug to baseline conditions, the baseline conditions comprising a first stress level;
         conducting an initial NMR scan of the core plug to acquire initial $T_2$ NMR measurements, the initial NMR scan of the core plug comprising an NMR scan of the slice of the core plug corresponding to the fracture while the core plug is subjected to the baseline conditions; and
         determining, based on the initial $T_2$ NMR measurements, an initial fracture pore volume of the fracture;
      conducting in-situ local slice selective NMR testing of the core plug comprising:

determining in-situ conditions of the core plug, the in-situ conditions comprising an in-situ stress level for the core plug;

subjecting the core plug to in-situ conditions comprising a second stress level that is greater than the first stress level and that corresponds to the in-situ stress level;

conducting an in-situ NMR scan of the core plug to acquire in-situ $T_2$ NMR measurements, the in-situ NMR scan of the core plug comprising an NMR scan of the slice of the core plug corresponding to the fracture while the core plug is subjected to the in-situ conditions;

measuring a volume of water expelled from the core plug in response to subjecting the core plug to the in-situ condition;

determining, based on the in-situ $T_2$ NMR measurements, an in-situ fracture pore volume of the fracture;

determining a difference between the initial fracture pore volume of the fracture and the in-situ fracture pore volume of the fracture;

comparing the difference between the initial fracture pore volume of the fracture and the in-situ fracture pore volume of the fracture to the volume of water expelled; and verifying, based on the comparison of the difference between the initial fracture pore volume of the fracture and the in-situ fracture pore volume of the fracture to the volume of water expelled, the in-situ fracture pore volume of the fracture.

20. The system of claim 19, wherein identifying the location of the fracture within the core plug comprises imaging the core plug to identify the location of the fracture within the core plug.

21. The system of claim 20, wherein the imaging comprises x-ray imaging or magnetic resonance imaging (MRI) of the core plug.

22. The system of claim 19, wherein the exterior of the fractured core plug is coated with wax or paraffin configured to provide for the core plug being sealed to inhibit the saturating fluid from leaking out of the fracture.

23. The system of claim 19, wherein the slice selective NMR test fixture comprises a tri-axial NMR test fixture comprising a first gradient coil oriented in an x direction, a second gradient coil oriented in a y direction, and a third gradient coil oriented in a z direction, wherein the orientation of the fracture is oriented at an angle relative to two or more of the x, y and z directions, and wherein the NMR scans of the slice of the core plug each comprise selectively energizing two or more of the first gradient coil, the second gradient coil and the third gradient coils to obtain corresponding ones of the in-situ $T_2$ measurements for the slice.

24. The system of claim 19, wherein the in-situ conditions comprise a confining stress or shear stress that is greater than a confining stress or shear stress of the first stress level.

25. The system of claim 19, wherein the in-situ conditions comprise an elevated in-situ stress level, and wherein the in-situ local slice selective NMR testing of the core plug comprises iteratively increasing a stress level applied to the core plug to reach the elevated in-situ stress level, and, for each iteration of an increase of the stress level applied to the core plug, conducting an in-situ NMR scan of the core plug and measuring a volume of water expelled from the core plug.

26. The system of claim 19, wherein the core plug is extracted from a formation of a reservoir and the reservoir is developed based on the in-situ fracture pore volume of the fracture.

27. The system of claim 26, wherein developing the reservoir comprises:

determining, based on the in-situ fracture pore volume of the fracture, operating parameters for a well in the formation; and operating the well in accordance with the operating parameters.

* * * * *

UNITED STATES PATENT AND TRADEMARK OFFICE
CERTIFICATE OF CORRECTION

PATENT NO. : 11,112,373 B1
APPLICATION NO. : 16/801492
DATED : September 7, 2021
INVENTOR(S) : AlSinan et al.

It is certified that error appears in the above-identified patent and that said Letters Patent is hereby corrected as shown below:

In the Claims

Column 18, Claim 14, Line 11 should read:
-- gradient coil to obtain corresponding ones of the in-situ T2 --

Column 20, Claim 23, Line 14 should read:
-- gradient coil and the third gradient coil to obtain corresponding --

Signed and Sealed this
Seventh Day of December, 2021

Drew Hirshfeld
*Performing the Functions and Duties of the*
*Under Secretary of Commerce for Intellectual Property and*
*Director of the United States Patent and Trademark Office*